United States Patent
Wong et al.

(10) Patent No.: US 7,692,488 B2
(45) Date of Patent: Apr. 6, 2010

(54) OUTPUT DC OFFSET PROTECTION FOR CLASS D AMPLIFIERS

(75) Inventors: Shiah Siew Wong, Singapore (SG); Wee Sien Hong, Singapore (SG); Chee Kuan Leong, Singapore (SG); Narciso Repollo Semira, Singapore (SG)

(73) Assignees: Panasonic Corporation, Osaka (JP); Panasonic Semiconductor Asia Pte. Ltd., Singapore (SG)

( * ) Notice: Subject to any disclaimer, the term of this patent is extended or adjusted under 35 U.S.C. 154(b) by 234 days.

(21) Appl. No.: 12/039,097

(22) Filed: Feb. 28, 2008

(65) Prior Publication Data

US 2009/0219090 A1   Sep. 3, 2009

(51) Int. Cl.
*H03F 3/217* (2006.01)

(52) U.S. Cl. .................. 330/251; 330/207 A; 330/9; 330/10

(58) Field of Classification Search ............... 330/251, 330/207 A, 9, 10
See application file for complete search history.

(56) References Cited

U.S. PATENT DOCUMENTS

| | | | |
|---|---|---|---|
| 6,388,514 B1 * | 5/2002 | King et al. .................. 330/10 |
| 6,998,911 B2 * | 2/2006 | Honda et al. ................. 330/10 |
| 7,078,964 B2 | 7/2006 | Risbo et al. |
| 7,146,141 B2 * | 12/2006 | Chen ...................... 455/232.1 |
| 7,257,385 B2 * | 8/2007 | Ono et al. ................ 455/232.1 |
| 7,286,074 B2 * | 10/2007 | Kudoh et al. ................ 341/162 |
| 7,382,114 B2 * | 6/2008 | Groom ..................... 323/271 |
| 7,603,094 B2 * | 10/2009 | Rahman et al. ........... 455/241.1 |
| 2007/0081616 A1 | 4/2007 | Yui et al. |
| 2007/0132509 A1 | 6/2007 | Hochizuki |
| 2007/0297536 A1 | 12/2007 | Yui et al. |
| 2008/0042743 A1 | 2/2008 | Wong et al. |

\* cited by examiner

*Primary Examiner*—Patricia Nguyen
(74) *Attorney, Agent, or Firm*—Greenblum & Bernstein P.L.C.

(57) ABSTRACT

A class D amplifier with output DC offset protection is disclosed. The DC offset protection receives a PWM input signals from the outputs and investigates the PWM output signals whether there is a large DC voltage difference is being reflected on the speaker load. If so, shutdown signal SD will be sent by the DC offset protection to the PWM control logic and gate driver, thus, shutting down the output of the class D system and preventing disastrous condition from being develop across the speaker.

22 Claims, 9 Drawing Sheets

OUTPUT DC OFFSET PROTECTION FOR CLASS D AMPLIFIERS

BACKGROUND OF THE INVENTION

The present invention relates to a class D audio power amplifier and is specifically directed to output DC offset protection.

In every amplification system, a standard design specification goal is the protection circuits and one of these is the output DC offset protection. DC offset voltage is defined as the DC output voltage when there is no applied voltage at the input. These can be due to mismatch of the elements or may be due to some component degradation over time, electrical overstress of the IC and any other means that will translate into a DC offset at the output of the amplifier causing large current to the speakers which may cause damage. It has also been observed that the large DC current dissipation on speaker give rise to a risk of fire. As this posed a serious issue on safety, techniques have been proposed to minimize the occurrence of this problem.

An example of such a technique was discussed in U.S. Pat. No. 7,078,964 titled DETECTION OF DC OUTPUT LEVELS FROM A CLASS D AMPLIFIER filed Oct. 12, 2004. In this prior art as seen in FIG. 1 and FIG. 2. a class D audio amplifier system 6 with DC output detection logic 4 was disclosed. The amplifier system 6 includes a multiple audio channels 7, each of which includes a pulse-width-modulator 9. The DC detection logic 4 includes a sigma-delta modulator and a digital low-pass filter that monitors the PWM output signals from the PWM modulators. The sigma-delta modulator operates at a first clock frequency, while the low-pass filter operates at a much lower clock frequency, so that AC audio components, PWM harmonics, and sigma-delta quantization error is suppressed from the DC detection. The modulated filtered signal is compared against a threshold level to determine whether the amplitude of the DC component at the PWM output is sufficiently high enough to constitute a fault. If so, a fault detection signal is issued, and the PWM modulators are disabled to prevent unsafe condition in the system. Such technology may be disadvantageous due to the fact that it detects offset at the PWM stage. The offset contributed by the succeeding stages are not taken into account such as the offset due to dead time, or due to the delay incurred by the parasitic capacitances at the output stages.

SUMMARY OF THE INVENTION

The purpose of this invention is to provide an output DC offset protection for a class D amplifier.

It is also an object of this invention to provide output DC protection which detects large differences on DC voltage component the output of the class D amplifier.

It is also an object of this invention to provide such offset protection for filterless class D amplifier.

The invention was implemented into a class D amplifier having an input stage that receives a capacitively coupled analog signals as its input and having it modulated into a digital output whose average value is directly proportional to the input signal's instantaneous amplitude.

According to the present invention, an Output DC offset protection is coupled to the output of the switching amplifier for generating a shutdown signal responsive to a DC component at the switching amplifier output, comprising;

a first low pass filter and second low pass filter, for filtering pulse width modulated signals; and provides input to a comparator, for comparing the signals;

a pulse edge detector, for minimizing jitter and producing a pulse;

a clock generator, for providing continuous pulse a counter and offset protection logic, for issuing a shutdown signal if an output DC offset is present.

According to one preferred embodiment of the present invention, a switching amplifier comprises:

a first driver arrangement for producing a first amplified output signal having a positive phase;

a second driver arrangement for producing a second amplified output signal having a negative phase which is opposite to said positive phase; and a DC offset protection arrangement for comparing said first and second amplified output signals, and for producing a shutdown signal when there is no signal overlap between said first and second amplified output signals after a predetermined time.

According to one preferred embodiment of the present invention, a method of protecting a switching amplifier from output DC offset, comprises:

producing a first amplified output signal having a positive phase;

producing a second amplified output signal having a negative phase which is opposite to said positive phase;

comparing said first and second amplified output signals, and producing a shutdown signal when there is no signal overlap between said first and second amplified output signals after a predetermined time.

DETAILED DESCRIPTION OF THE PREFERRED EMBODIMENTS

The following description explains the present invention in according to its preferred embodiment.

First Embodiment

Figure 1:
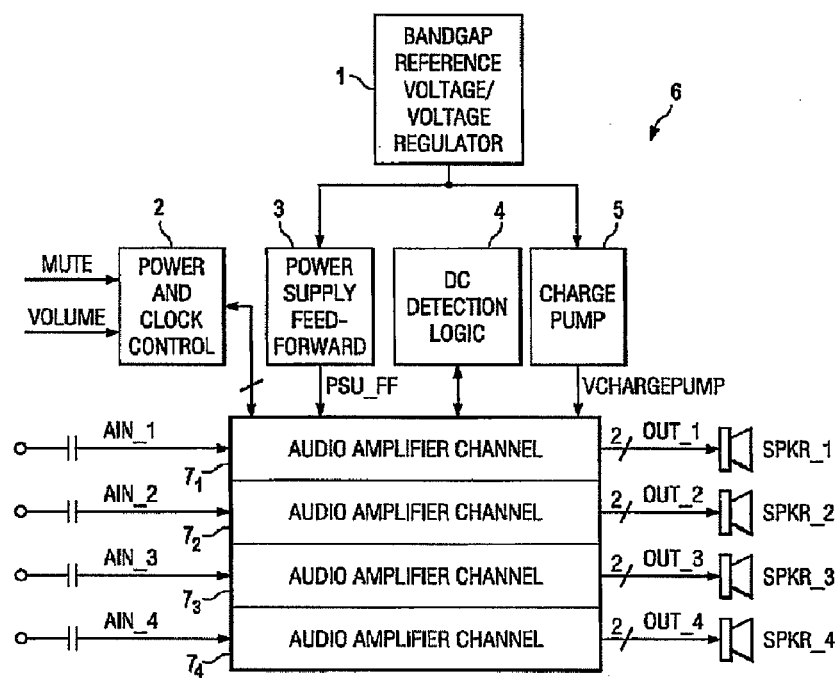
FIG. 1 is a block diagram showing a digital audio amplifier, according to the prior art.
Figure 2:
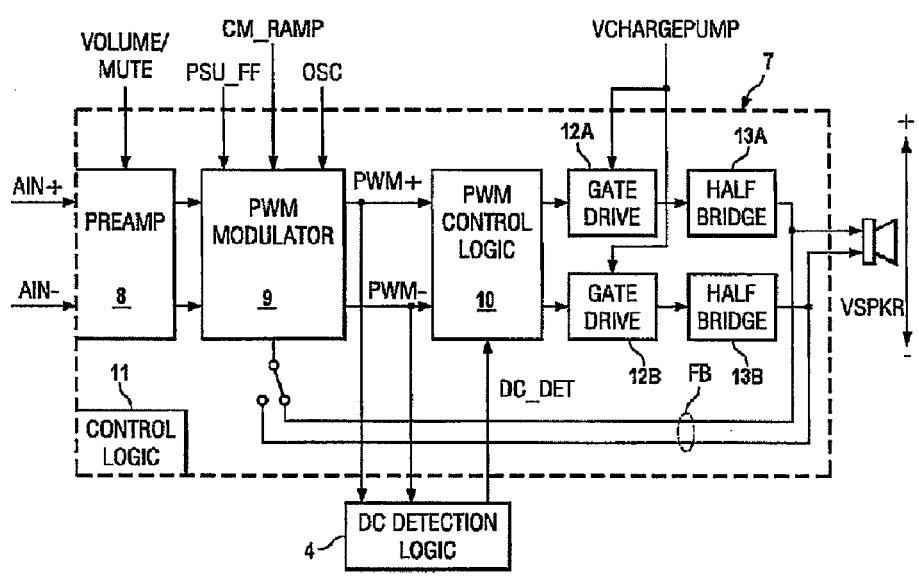
FIG. 2 is a block diagram showing an audio amplifier for an output channel in the digital audio amplifier system in FIG. 1, according to the prior art.
Figure 3:
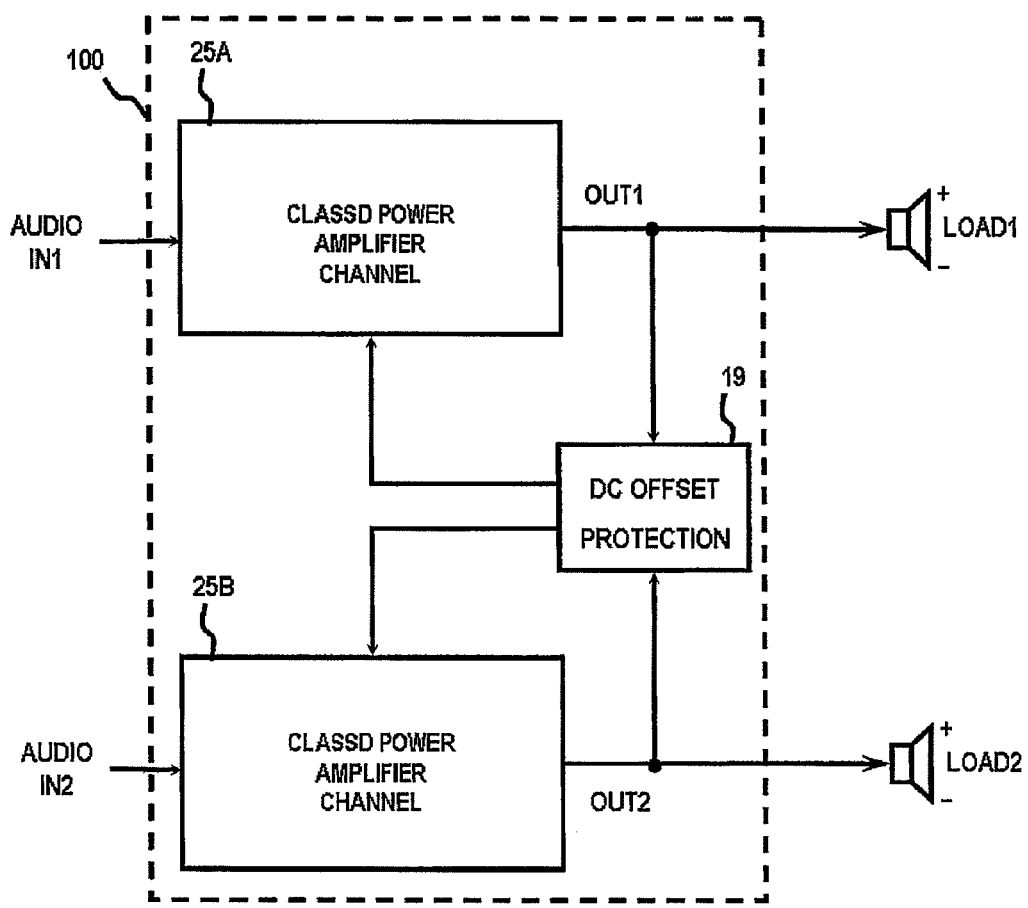
FIG. 3 is a block diagram showing a switching audio amplifier according to a preferred embodiment of the invention.

Referring to FIG. 3, a first embodiment of a class D power amplifier 100 according to the present invention is shown. In this example, system 100 is a two channel BTL class D amplifier that drives a speaker load. The Class D power amplifier 100 may be of any type, such types are, analog class D amplifier or a digital class D amplifier. Analog class D amplifier is an amplifier which receives analog signals as its input and goes to a process in which it is converted to a sequence of pulses whose averaged value is directly proportional to the signal's instantaneous amplitude. While on the other hand, digital class D amplifier is the one that receives pulses or digital signals as its input. Also, it is contemplated that these amplifiers can either use pulse width modulation, pulse density modulation (sometimes referred to as pulse frequency modulation) or more advanced form of modulation such as Delta-sigma modulation. In addition the amplifier 100 can also be a filterless class D amplifier and can have more or fewer channel output depending on the requirement and specification. As for the purpose of simplification on the discussion, the proceeding discussion will focus on analog switching amplifier using PWM modulation.

Further referring to FIG. 3, it is, of course contemplated that system 100 can have multi-channel output depending on the requirement and specification. The speaker can be of any resistive/wattage value depending also on the system specification. Audio signals IN1 and IN2 are received by each of the power amplifier channels 25A and 25B, respectively. The signals from each channel are then used to drive the speakers, LOAD1 and LOAD2. Here, a DC Offset Protection Block 19 is also coupled to the output which constantly monitors for any DC offset.

Now referring to FIG. 4A, the construction of the class D power amplifier channel 25 will be discussed further according to the present invention. It is contemplated that the power amplifier channel 25A and 25B are constructed identical corresponding with the construction of the power amplifier 25 in FIG. 4A.

A differential audio signal IN+ and IN− is coupled to the input buffer 14. The input buffer 14 serves to provide impedance matching between the input impedance of the Error Amp 15 to the input differential signal source IN+ and IN−. The output from the input buffer 14, together with the feedback signals FB, are inputted to a typical error amp 15 so as to achieve stability and reduce the distortion at the outputs OUT+ and OUT−. Then the outputs of the error amp will provide signal to the PWM modulator 16. PWM modulator generates two pulse-width-modulated outputs, one of which is inverted. PWM control logic 17 is provided to process the PWM output. It will introduce the appropriate delay and adequate pulse width in order to avoid a shoot-through current. Shoot-through current is the rush of current that occurs while both output power transistors are on. For example, a shoot-through will occur if both output power transistors 20 and 21 are on at the same time.

The gate driver 18A, 18B provide the appropriate voltage levels for each output transistors 20, 21, 22 and 23. Output transistors 20, 21, 22 and 23 can be any bipolar junction transistor or MOS transistor. These transistors will produce pulse-width-modulated output signals, which will pass through the output low pass filter to remove the unnecessary high frequency components leaving only the audio frequency signal and fed to the speaker LOAD.

Figure 4A:
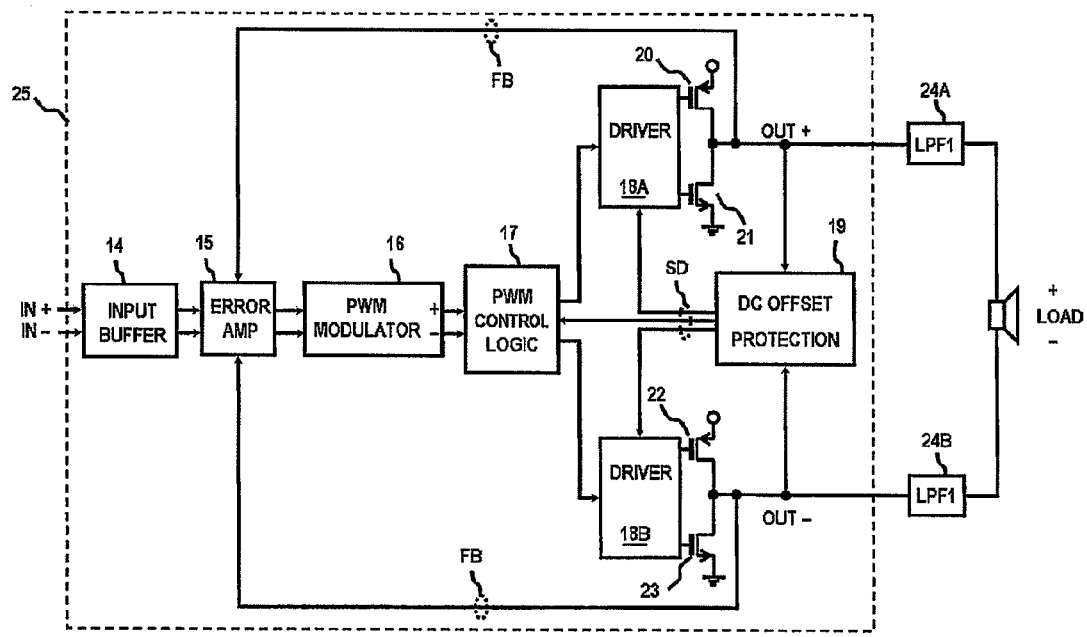
FIG. 4A is a block diagram showing an audio amplifier for an output channel in the switching audio amplifier system according to a preferred embodiment of the invention.

We shall now explain the operation of the DC offset protection 19, as shown in FIG. 4A. The DC offset protection 19 receives PWM input signals from the outputs OUT+ and OUT−. As will be described in detail below, the DC offset protection 19 monitors the PWM output signals and checks whether a large DC voltage difference is being reflected on the speaker load. If so, shutdown signal SD will be sent by the DC offset protection 19 to the PWM control logic 17 and gate driver 18A, 18B, thus shutting down the output of the class D power amplifier 25 and preventing disastrous condition from being developed across the speaker.

Figure 5A:
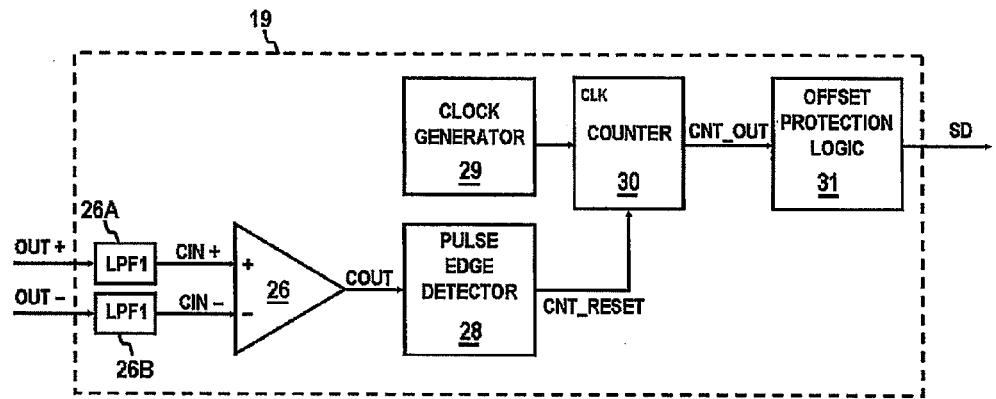
FIG. 5A is a block diagram showing the implementation of the output DC offset protection, according to a preferred embodiment of the invention.

Referring to FIG. 5A, the construction of the output DC offset protection will be described. OUT+ and OUT− are PWM output signals and are filtered by a low pass filter 26A and 26B respectively. These low pass filters are any first order RC low pass filter and are intentionally designed to have an output with a measurable ripple which is needed for the DC offset detection at no input signal condition which will be discussed further below.

The filtered outputs CIN+ and CIN− are then inputted to the comparator 26. Comparator 26 is a typical comparator that may be constructed using conventional architecture. Like typical comparators, Comparator 26 produces logic signal high when CIN+ is higher than CIN−, while on the other hand outputs a logic signal low when CIN− is higher than CIN+. COUT produced by comparator 26 will go through a pulse edge detector 28 in which the output (CNT_RESET) will be used for resetting the counter 30.

Still referring to FIG. 5A, output dc protection 19 also includes a clock generator 29 and a counter 30. The clock generator 29 can be any oscillator with a pulsating output while the counter 30 is any n-bit digital counter which actually produces a pulse signal CNT_OUT after a pre-determined number of clock pulses are received. Hence, signal from a clock generator 29 is applied to the input of counter 30 in which after a predetermined number of clock pulses are received, counter 30 will output a pulse CNT_OUT if no reset signal is received. Upon receiving the output signal CNT_OUT from counter 30, the offset protection logic 31 will produce a shutdown signal for the class D power amplifier 25.

<CASE 1: No Output DC Offset and No Input Signal>

Figure 7A:
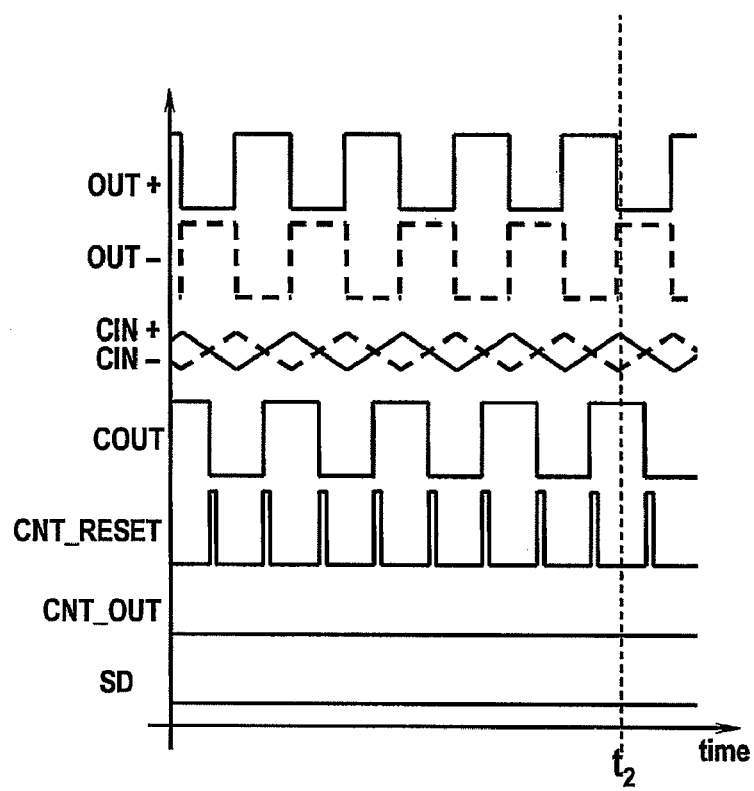
FIG. 7A is a timing diagram illustrating the timing of signals in the output DC protection when no audio signal and no offset condition, according to a preferred embodiment of the invention.

FIG. 7A illustrates a timing diagram according to the described embodiment of the output DC offset protection 19 for class D power amplifier 25. Here, it shows the behavior of the protection 19 when there is no output DC offset. Also, since input audio signals are not present, the output signals are switching with a 50 percent duty cycle.

OUT+ and OUT− are from the full bridge formed by the output transistor 20, 21 and 22, 23 respectively. These signals are then processed by the low pass filters 26A and 26B, outputting CIN+ and CIN−, respectively. As stated above, the filter used was a first order RC filter to deliberately make CIN+ and CIN− to have a noticeable ripple component. Since the system does not have offset, the two filtered signals CIN+ and CIN− will be overlapping, thus producing a pulsating signal COUT at the comparator output and after passing through the pulse edge detector 28, a signal will be applied to the counter 30 in the form of a reset signal CNT_RESET. The reset signals CNT_RESET are short pulses generated for every rising and falling edges of COUT. Since 'reset' signals are continuously receive by the counter at time much lesser than $t_2$ ($t_2$ is a predetermined time where the counter sends a CNT_OUT signal), the counter 30 will not issue a CNT_OUT signal. Consequently, no SD signal will be issued.

<CASE 2: Output DC Offset Present, and No Input Signal>

Figure 6B:
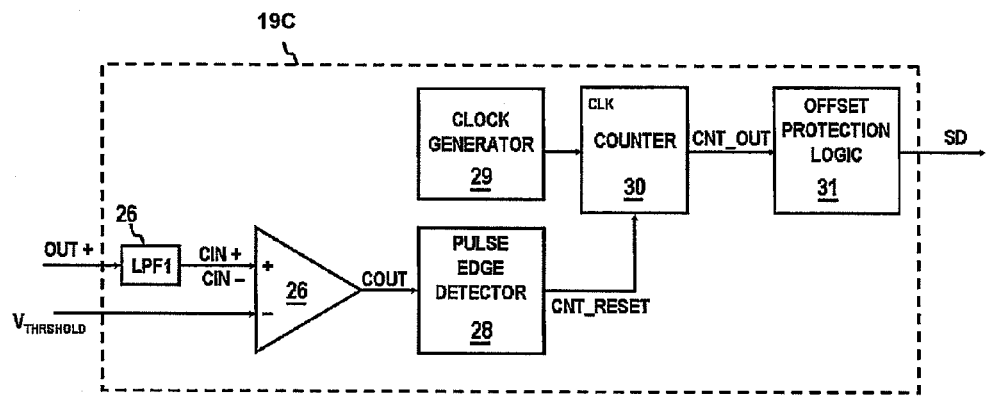
FIG. 6B is a block diagram showing yet another implementation of the output DC offset protection, according to a preferred embodiment of the invention.
Figure 7B:
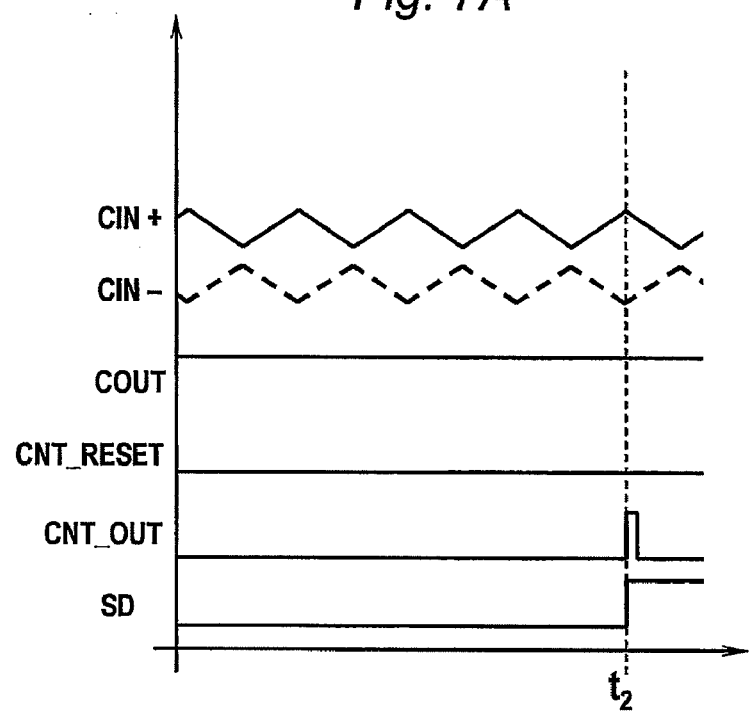
FIG. 7B is a timing diagram illustrating the timing of signals in the output DC protection when no audio signal and with offset condition, according to a preferred embodiment of the invention.

Now, referring to FIG. 7B consider the case where the outputs have a DC offset. The filtered outputs CIN+ and CIN− are now not overlapping due to the offset. Thus, this results in a constant high level or low level COUT signal depending on whether CIN+ or CIN− is higher. For the example as shown in FIG. 6B, CIN+ is higher than CIN−, therefore COUT will produce a constant HIGH output. Since there are no high to low transitions or low to high transitions at COUT, the pulse edge detector 28 will not issue a CNT_RESET. Therefore at a predetermined time $t_2$ ($t_2$ is a predetermined time where the counter sends a CNT_OUT signal), the counter will send a pulse signal to activate the protection logic 31. SD signal will now be issued to turn off the system from a potentially dangerous condition.

<CASE 3: No Output DC Offset and with Input Signal>

Figure 8A:
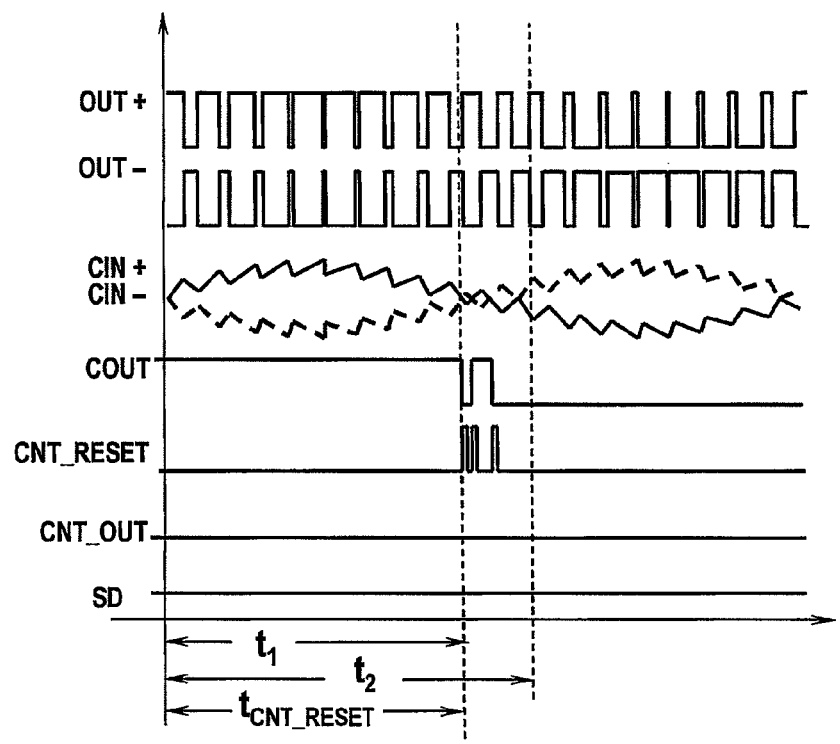
FIG. 8A is a timing diagram illustrating the timing of signals in the output DC protection when an audio signal is preset and no offset condition, according to a preferred embodiment of the invention.

FIG. 8A shows another example sequence of the output DC offset protection system according to the operation of the described embodiment. Here, the example shows the behavior of the offset protection 19 when there is no offset and the PWM outputs are now modulated with an input audio signal. The voltage at the comparator 26 input will have an audio component in it. As shown CIN+ and CIN− will cross each other at a definite time $t_1$ which is approximately equal to half of the period of the audio frequency. Thus, if the two signals do not traverse at time $t_1$, it can be concluded that output DC offset is present. According to the embodiment of this invention, this is the basis on how to set the time when counter will send a CNT_OUT signal (In setting the value of $t_2$, the period of the lowest audio frequency must be considered). Also, it can be seen that as the two signals intersect, a CNT_RESET at time $t_1$ was issued, thus resetting the counter 30. This action will be repeated for every cycle of CIN+ and CIN−, as long as the power amplifier 25 has no DC offset.

<CASE 4: Output DC Offset Present and with Input Signal>

Figure 8B:
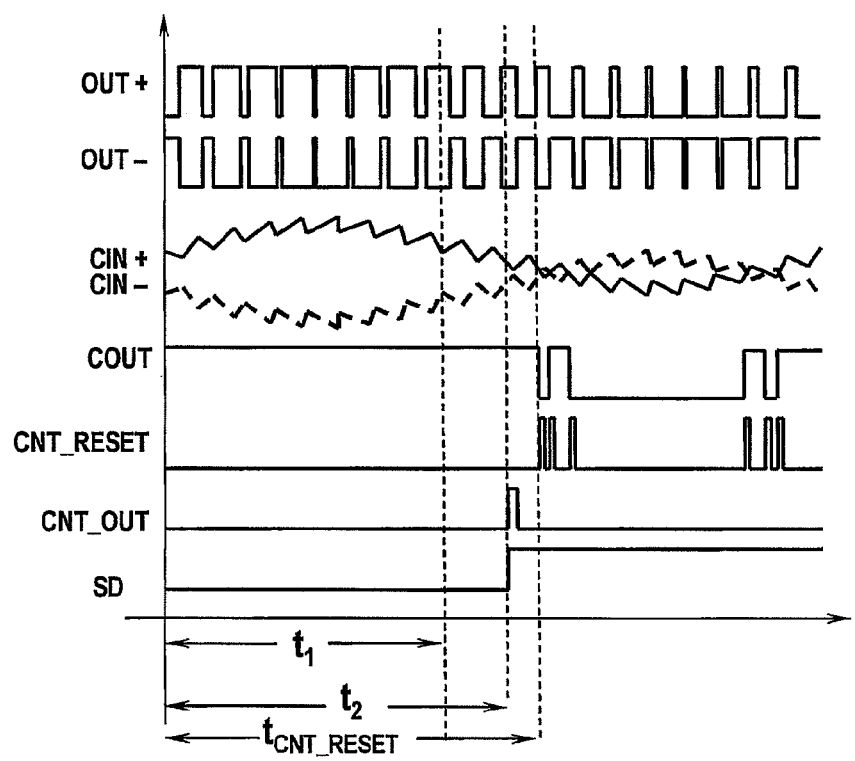
FIG. 8B is a timing diagram illustrating the timing of signals in the output DC protection when an audio signal is preset and with offset condition, according to a preferred embodiment of the invention.
Figure 9A:
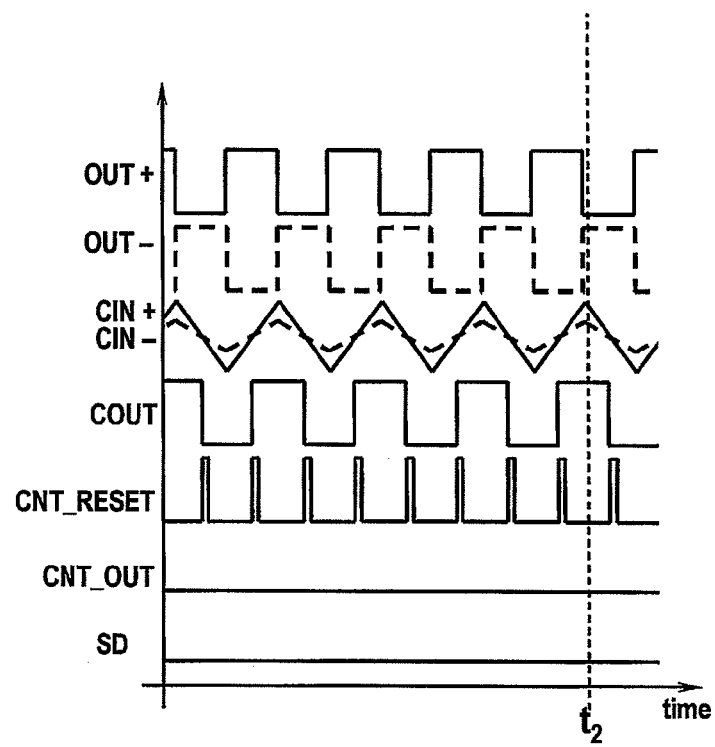
FIG. 9A is a timing diagram illustrating the timing of signals in the output DC protection when no audio signal and no offset condition using filterless class D amplifier, according to a preferred embodiment of the invention.
Figure 9B:
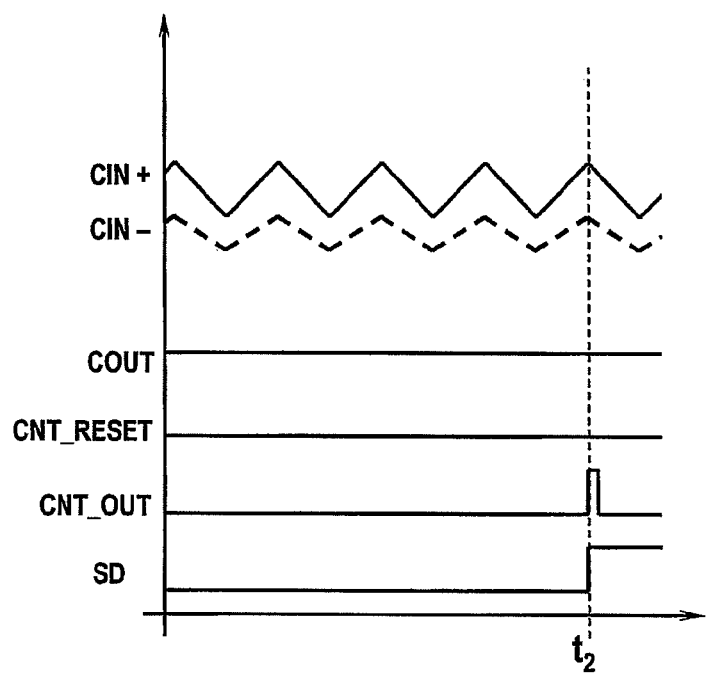
FIG. 9B is a timing diagram illustrating the timing of signals in the output DC protection when no audio signal and with offset condition using filterless class D amplifier, according to a preferred embodiment of the invention.
Figure 10A:
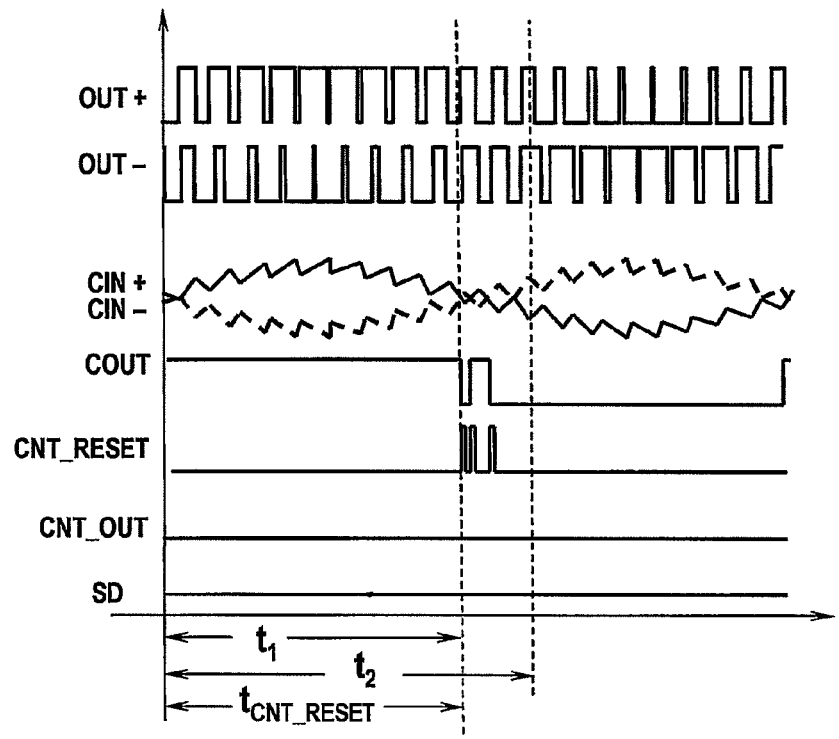
FIG. 10A is a timing diagram illustrating the timing of signals in the output DC protection when an audio signal is preset and no offset condition using filterless class D amplifier, according to a preferred embodiment of the invention.
Figure 10B:
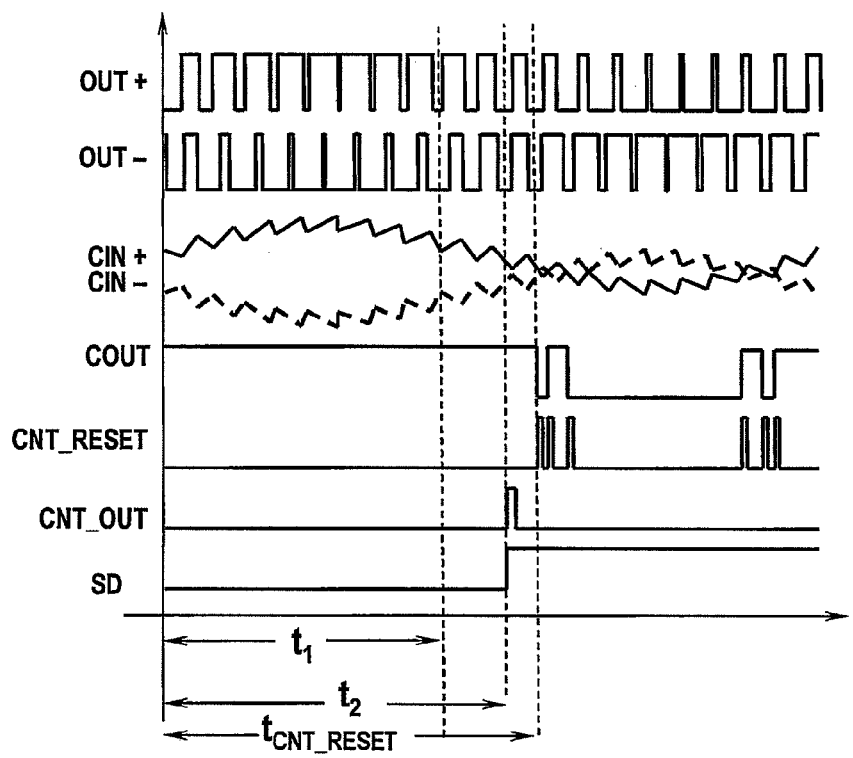
FIG. 10B is a timing diagram illustrating the timing of signals in the output DC protection when an audio signal is preset and with offset condition using filterless class D amplifier, according to a preferred embodiment of the invention.

Referring to FIG. 8B, for a case of a DC offset voltage present, the CNT_RESET signal will only be outputted after a time interval of more than $t_2$. Since $t_{CNT\_RESET}$ is more than $t_2$, the counter 30 will send a CNT_OUT signal to the offset protection logic 31. This will in turn output the shutdown signal SD, which will cause the shutdown of the power amplifier 25.

It is noted for CASE 4, $t_2$ is a predetermined time where the counter sends a CNT_OUT signal; $t_1$ is approximately equal to half of the period of the audio frequency.

Figure 4B:
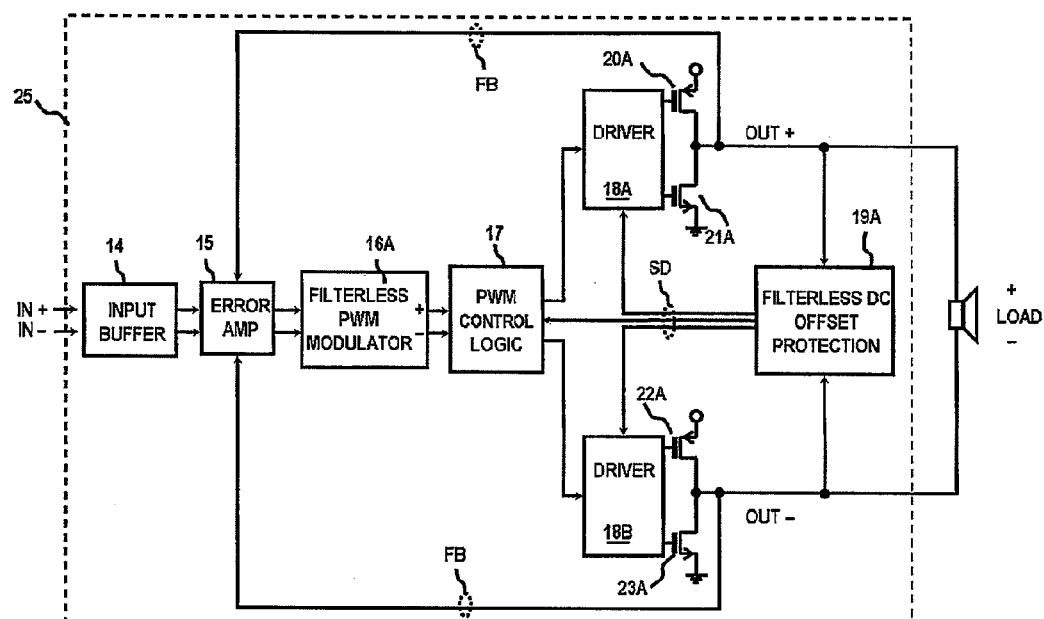
FIG. 4B is a block diagram showing another implementation of an audio amplifier for a filterless switching amplifier, according to a preferred embodiment of the invention.
Figure 5B:
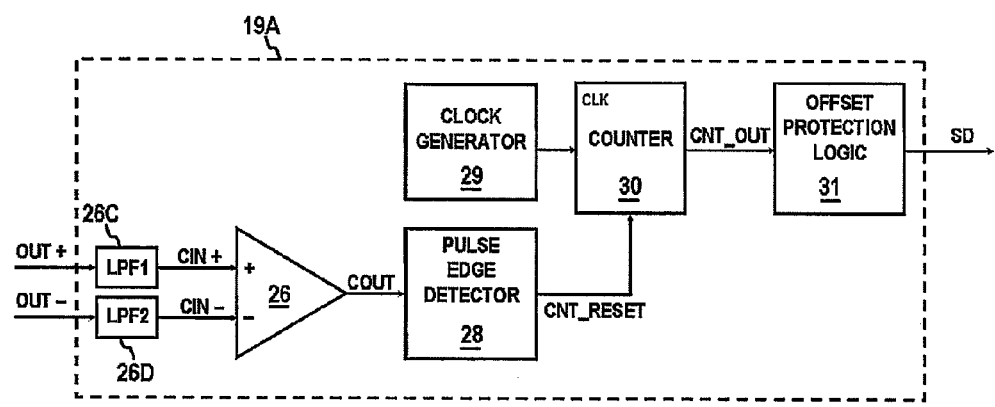
FIG. 5B is a block diagram showing another implementation of the output DC offset protection, according to a preferred embodiment of the invention.

FIG. 4B shows another implementation of the output DC offset protection as it is used in a filterless class D architecture. Operation is much similar to the one previously discussed (refer to FIG. 4A operation), except that the amplifier now is not using any low pass filter for driving the LOAD and uses a filterless PWM Modulator 16A. Referring to FIG. 5B, the same set-up was used for the offset protection 19A in a filterless class D architecture. However, the filters used have different cutoff frequencies, that is, LPF1 (26C) has a higher cutoff frequency than the second low pass filter LPF2 (26D). FIG. 9A, FIG. 9B, FIG. 10A and FIG. 10B, shows the timing diagrams for the filterless DC offset protection 19A. As discussed previously, the two output signals are filtered and compared to produce a reset signal for the counter 30. For the case of FIG. 9A and FIG. 10A, no shutdown signal will be sent while for case of FIG. 9B and FIG. 10B, a shutdown SD signal will be sent to turn off the class D 25 due to the offset detected.

Figure 6A:
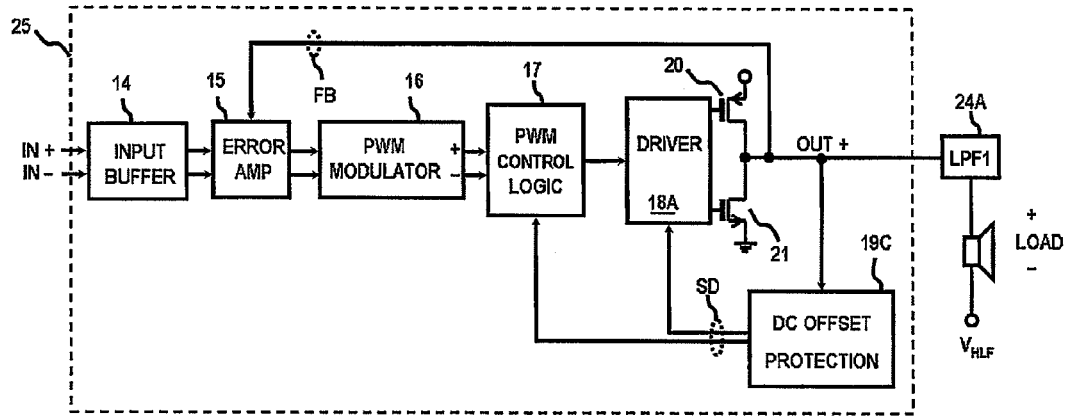
FIG. 6A is a block diagram showing yet another implementation of an audio amplifier, according to a preferred embodiment of the invention.

FIG. 6A show another implementation of the output DC protection used in a single-ended class D amplifier. Operation now requires the speaker to be connected to a voltage source $V_{HLF}$. Referring to FIG. 6B, the offset DC protection 19C will now compare the filtered output OUT+ to a predetermined DC threshold voltage $V_{THRSHOLD}$ to generate a reset signal CNT_RESET. And if an offset is present, no reset CNT_RESET will be sent and then system will stop operation.

It is contemplated that a method of protecting switching amplifier against output DC offset was presented by comparing a first filtered output signal with a predetermined threshold voltage and generate a reset signal and if the said reset signal is not present or delayed at a predetermined time, will shutdown or deactivate the switching amplifier. It was also known according to the present invention that the threshold voltage can be a DC reference voltage if operated in a single-ended class D amplifier or it can be the filtered output of the second low pass filter for BTL type class D amplifier. Moreover, it is contemplated that the offset protection 19 can detect voltage build up at the output whether with or without the presence of an audio signal according to the embodiment of the invention. Also, the invention was implemented without a need for complex technology.

Having described the above embodiment of the invention, various alternations, modifications or improvement could be made by those skilled in the art. Such alternations, modifications or improvement are intended to be within the spirit and scope of this invention. The above description is by ways of example only, and is not intended as limiting. The invention is only limited as defined in the following claims.

What is claimed is:

1. A switching amplifier comprising:
   an input stage that receives analog signals as its input and having it modulated into a digital output whose average value is directly proportional to the input signal's instantaneous amplitude; and
   output DC offset protection, for generating a shutdown signal responsive to a DC component at the switching amplifier output.

2. The switching amplifier of claim 1, wherein the DC offset protection comprises:

a first low pass filter and second low pass filter, for filtering pulse width modulated signals;

a comparator, for comparing the signals;

a pulse edge detector, for minimizing jitter and producing a pulse;

a clock generator, for producing continuous pulse a counter and offset protection logic, for issuing a shutdown signal if an output DC offset is present.

3. The switching amplifier of claim 2, wherein the DC offset protection is coupled to the output of the said switching amplifier.

4. The switching amplifier of claim 3, wherein the output of the amplifier are used as input signals to the first and second low pass filter.

5. The switching amplifier of claim 3, wherein the said first and second low pass filter is a first order RC low pass filter.

6. The switching amplifier of claim 3, wherein the filtered output of the first and second low pass filter are inputted and compared by the comparator and provides a pulsating high or a low output depending on which input is higher.

7. The switching amplifier of claim 3, wherein the comparator output is used as an input for the pulse edge detector.

8. The switching amplifier of claim 3, wherein the pulse edge detector produces a pulse signals to be applied as a reset for the counter.

9. The switching amplifier of claim 3, wherein the clock generator provides continues pulse to the counter.

10. The switching amplifier of claim 3, wherein the counter produces a signal after counting a predetermined time, if no reset signal is received from the pulse edge detector within said predetermined time.

11. The switching amplifier of claim 1, wherein the DC offset protection uses a filterless architecture.

12. A method of protecting a switching amplifier against output DC offset comprising:

comparing a first filtered output signal with a predetermined threshold voltage and generating a reset signal;

generating an offset protection signal to deactivate the said switching amplifier if the said reset signal is not activated during a predetermined time period.

13. The method according to claim 12, wherein the said first filtered output signal is derived from a first output signal of the said switching amplifier.

14. The method according to claim 12, wherein the said predetermined threshold voltage is a dc reference voltage.

15. The method according to claim 12, wherein the said predetermined threshold voltage is a second filtered output signal derived from a second output signal of the said switching amplifier.

16. The method according to claim 12, wherein the said reset signal is a function of the said first filtered output signal and the said predetermined threshold voltage.

17. The method according to claim 12, wherein the function of the said offset protection signal is to transfer the state of the said switching amplifier to another state that will not cause constant dc current flow to a load of the said switching amplifier.

18. The method according to claim 13, wherein the said first output signal can be a PWM, PDM or sigma Delta modulated switching signal.

19. The method according to claim 15, wherein the said second output signal can be a PWM, PDM or sigma Delta modulated switching signal.

20. The method according to claim 17, wherein the said load of the said switching amplifier can be a resistive load, a capacitive load or an inductive load.

21. A switching amplifier comprising:

a first driver arrangement for producing a first amplified output signal having a positive phase;

a second driver arrangement for producing a second amplified output signal having a negative phase which is opposite to said positive phase; and a DC offset protection arrangement for comparing said first and second amplified output signals, and for producing a shutdown signal when there is no signal overlap between said first and second amplified output signals after a predetermined time.

22. A method of protecting a switching amplifier from output DC offset, comprising:

producing a first amplified output signal having a positive phase;

producing a second amplified output signal having a negative phase which is opposite to said positive phase;

comparing said first and second amplified output signals, and producing a shutdown signal when there is no signal overlap between said first and second amplified output signals after a predetermined time.

* * * * *